United States Patent
Won et al.

(10) Patent No.: US 12,060,511 B2
(45) Date of Patent: Aug. 13, 2024

(54) CORE-SHELL QUANTUM DOTS HAVING HIGH QUANTUM EFFICIENCY, AND AN ELECTRONIC DEVICE INCLUDING THE SAME

(71) Applicant: SAMSUNG ELECTRONICS CO., LTD., Suwon-si (KR)

(72) Inventors: Yuho Won, Seoul (KR); Jeong Hee Lee, Seongnam-si (KR); Eun Joo Jang, Suwon-si (KR); Ha Il Kwon, Suwon-si (KR); Sujin Park, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 261 days.

(21) Appl. No.: 17/063,821

(22) Filed: Oct. 6, 2020

(65) Prior Publication Data
US 2021/0115331 A1    Apr. 22, 2021

(30) Foreign Application Priority Data

Oct. 17, 2019    (KR) .................. 10-2019-0129095

(51) Int. Cl.
*C09K 11/08*    (2006.01)
*C09K 11/88*    (2006.01)
(Continued)

(52) U.S. Cl.
CPC ........ *C09K 11/883* (2013.01); *C09K 11/0883* (2013.01); *H10K 50/115* (2023.02); *B82Y 20/00* (2013.01); *B82Y 40/00* (2013.01)

(58) Field of Classification Search
CPC ... Y10T 428/2991; B82Y 20/00; H01L 33/30; H01L 33/04; H01L 33/16; C09K 11/08; C09K 11/70
See application file for complete search history.

(56) References Cited

U.S. PATENT DOCUMENTS 9,260,652 B2    2/2016  Peng et al.
2008/0305334 A1*  12/2008  Jang ............... C09K 11/883
                                                   427/402
(Continued)

FOREIGN PATENT DOCUMENTS

KR    20180094200 A    8/2018
KR    20180108012 A    10/2018
(Continued)

OTHER PUBLICATIONS

Ung et al., "Europium doped In(Zn)P/ZnS colloidal quantum dots", Dalton Transactions, Apr. 4, 2013, pp. 12606-12610, vol. 42 (Year: 2013).*

(Continued)

*Primary Examiner* — Hoa (Holly) Le
(74) *Attorney, Agent, or Firm* — CANTOR COLBURN LLP

(57) ABSTRACT

A quantum dot including a semiconductor nanocrystal core including indium (In) and phosphorus (P) and a semiconductor nanocrystal shell disposed on the semiconductor nanocrystal core, the semiconductor nanocrystal shell including zinc (Zn) and selenium (Se), wherein the semiconductor nanocrystal shell is doped with a dopant metal having a larger ion radius than a radius of an $Zn^{2+}$ ion, the quantum dot does not include cadmium, and the quantum dot has a quantum efficiency of greater than or equal to about 70% and a full width at half maximum (FWHM) of an emission peak of less than or equal to about 40 nanometers (nm), and an electroluminescent device including the same.

19 Claims, 4 Drawing Sheets

(51) Int. Cl.
*H10K 50/115* (2023.01)
*B82Y 20/00* (2011.01)
*B82Y 40/00* (2011.01)

(56) References Cited

U.S. PATENT DOCUMENTS

| | | | |
|---|---|---|---|
| 2013/0299772 A1* | 11/2013 | Cohen | H01L 29/365 438/542 |
| 2015/0166342 A1 | 6/2015 | Liu et al. | |
| 2017/0121598 A1* | 5/2017 | Min | C09K 11/02 |
| 2018/0019371 A1* | 1/2018 | Steckel | H01L 27/1225 |
| 2019/0011782 A1* | 1/2019 | Pickett | C09K 11/025 |
| 2019/0169500 A1* | 6/2019 | Kim | G02F 1/1303 |

FOREIGN PATENT DOCUMENTS

| | | | | |
|---|---|---|---|---|
| KR | 20190065177 A | | 6/2019 | |
| WO | WO-2021018060 A1 * | | 2/2021 | B82Y 20/00 |

OTHER PUBLICATIONS

Kemar R. Reid et al., "Chemical Structure, Ensemble and Single-Particle Spectroscopy of Thick-Shell InP—ZnSe Quantum Dots," Nano Lett., Dec. 28, 2017, pp. 709-716, vol. 18.

Yang Li et al., "Stoichiometry-Controlled InP-Based Quantum Dots: Synthesis, Photoluminescence, and Electroluminescence," J. Am. Chem., Apr. 9, 2019, pp. 6448-6452, vol. 141.

* cited by examiner

CORE-SHELL QUANTUM DOTS HAVING HIGH QUANTUM EFFICIENCY, AND AN ELECTRONIC DEVICE INCLUDING THE SAME

CROSS-REFERENCE TO RELATED APPLICATION

This application claims priority to and the benefit of Korean Patent Application No. 10-2019-0129095 filed in the Korean Intellectual Property Office on Oct. 17, 2019, and all the benefits accruing therefrom under 35 U.S.C. § 119, the entire content of which in its entirety is herein incorporated by reference.

BACKGROUND

1. Field

Quantum dots and electronic devices including the same are disclosed.

2. Description of the Related Art

Quantum dots (i.e., nano-sized semiconductor nanocrystals) may have different band gap energies by controlling sizes and compositions of the semiconductor nanocrystals, and thus may emit light of various photoluminescence wavelengths. Quantum dots may exhibit electroluminescence and photoluminescence properties. In a chemical wet process, organic materials such as dispersing agents are coordinated on, e.g., bound to, the surface of the semiconductor nanocrystal during a crystal growth to provide quantum dots having controlled sizes and photoluminescence properties. Photoluminescence properties of quantum dots may be applied in various fields. From an environmental standpoint, development of cadmium-free quantum dots capable of realizing, e.g., exhibiting, improved photoluminescence properties is desirable.

SUMMARY

An embodiment provides a cadmium-free quantum dot exhibiting high efficiency and long life span by inhibiting energy transfer between particles in a thin film state.

An embodiment provides an electronic device including the cadmium-free quantum dot.

A quantum dot according to an embodiment includes a semiconductor nanocrystal core including indium (In) and phosphorus (P) and a semiconductor nanocrystal shell disposed on the semiconductor nanocrystal core, the semiconductor nanocrystal shell including zinc (Zn) and selenium (Se), wherein the semiconductor nanocrystal shell is doped with a dopant metal having a larger ion radius than a radius of a $Zn^{2+}$ ion, the quantum dot does not include cadmium, and the quantum dot has a quantum efficiency of greater than or equal to about 70% and a full width at half maximum (FWHM) of an emission peak of less than or equal to about 40 nanometers (nm).

The semiconductor nanocrystal shell may have a thickness of greater than or equal to about 2 nm.

The dopant metal may be a non-light emitting metal.

The dopant metal may include sodium (Na), calcium (Ca), potassium (K), zirconium (Zr), yttrium (Y), strontium (Sr), samarium (Sm), europium (Eu), or a combination thereof.

The dopant metal may be present in an amount of about 0.01 moles to about 10 moles, based on 100 moles of a semiconductor nanocrystal forming the semiconductor nanocrystal shell.

The dopant metal may be present in an amount of about 0.05 moles to about 5 moles, based on 100 moles of a semiconductor nanocrystal forming the semiconductor nanocrystal shell.

The semiconductor nanocrystal shell may not include an outermost layer including zinc and sulfur.

The semiconductor nanocrystal shell may not include sulfur.

A mole ratio of phosphorus relative to indium in the quantum dot may be less than or equal to about 1:1.

A mole ratio of zinc relative to indium in the quantum dot may be greater than or equal to about 10:1.

A mole ratio of selenium relative to indium in the quantum dot may be greater than or equal to about 10:1.

A semiconductor nanocrystal forming the semiconductor nanocrystal core may further include zinc.

A particle size of the quantum dot may be greater than or equal to about 8 nm.

The quantum dot may have a peak emission wavelength between about 600 nm and about 650 nm.

An embodiment provides an electronic device including a first electrode and a second electrode facing each other, a quantum dot light emitting layer disposed between the first electrode and the second electrode, the quantum dot light emitting layer including the quantum dot according to an embodiment.

The quantum dot light emitting layer may include a plurality of quantum dots and a particle size distribution of the quantum dots may be less than or equal to about 20% of an average value.

The electronic device may have external quantum efficiency (EQE) of greater than or equal to about 10% and a life span T95 at 1,000 nits of greater than or equal to about 10 hours.

The electronic device may further include a charge auxiliary layer between the first electrode and the quantum dot light emitting layer, between the second electrode and the quantum dot light emitting layer, or a combination thereof.

In the electronic device, the first electrode may include an anode, and the second electrode may include a cathode, and the electronic device may further include a hole injection layer, a hole transport layer, an electron blocking layer, or a combination thereof between the first electrode and the quantum dot light emitting layer, and an electron injection layer, an electron transport layer, a hole blocking layer, or a combination thereof between the second electrode and the quantum dot light emitting layer.

The electronic device may include the electron transport layer between the second electrode and the quantum dot light emitting layer, and the electron transport layer may include a zinc metal oxide.

According to an embodiment, the quantum dot including the semiconductor nanocrystal core including indium and phosphorus, and the semiconductor nanocrystal shell including zinc and selenium is cadmium-free and environmentally-friendly. Also, the quantum dot may achieve high quantum efficiency and a narrow emission wavelength full width at half maximum (FWHM) even though it does not include a semiconductor nanocrystal shell that includes an outermost layer including, e.g., consisting of, zinc and sulfur, which may increase structural stability and efficiency of a quantum dot including a semiconductor nanocrystal core including indium and phosphorus and a semiconductor nanocrystal shell including zinc and selenium. The quantum dots may not include a semiconductor nanocrystal shell including an outermost layer including, e.g., consisting of, zinc and, and thus, when manufacturing an electroluminescent device including the light emitting layer, injection and transfer characteristics of charges are improved, and an electroluminescent device having improved external quantum efficiency, brightness, and life span are provided. In addition, since an additional process for forming a semiconductor nanocrystal shell including an outermost shell including, e.g., consisting of, zinc and sulfur may be omitted, processes and time for quantum dot synthesis may be reduced.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1A:
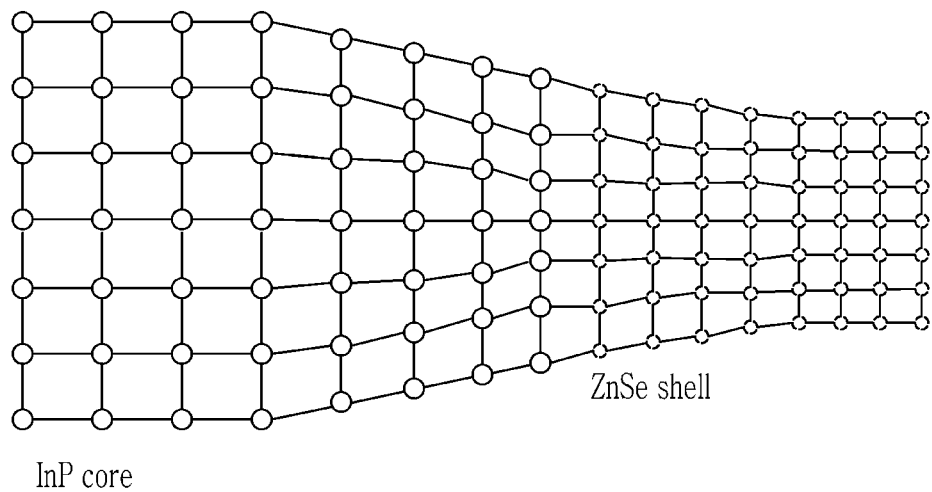
FIG. 1A is a partial cross-sectional view schematically showing a lattice shape of a core and a shell of a quantum dot including, e.g., consisting of, a semiconductor nanocrystal core including indium and phosphorus and a semiconductor nanocrystal shell including zinc and selenium.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising," will be understood to imply the inclusion of stated elements but not the exclusion of any other elements.

Further, the singular includes the plural, unless mentioned otherwise. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

In the drawings, the thickness of layers, films, panels, regions, etc. are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer" or "section" discussed below could be termed a second element, component, region, layer, or section without departing from the teachings herein.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a work function or a (highest occupied molecular orbital (HOMO) or lowest unoccupied molecular orbital (LUMO)) energy level is expressed as an absolute value from a vacuum level. In addition, when the work function or the energy level is referred to be "deep," "high" or "large," the work function or the energy level has a large absolute value based on "0 eV" of the vacuum level, while when the work function or the energy level is referred to be "shallow," "low," or "small," the work function or energy level has a small absolute value based on "0 eV" of the vacuum level.

As used herein, the term "Group" may refer to a group of Periodic Table.

As used herein, "Group I" may refer to Group IA and Group IB, and examples thereof may include Li, Na, K, Rb, and Cs, but are not limited thereto.

As used herein, "Group II" may refer to Group IIA and Group IIB, and examples of Group II metal may be Cd, Zn, Hg, and Mg, but are not limited thereto.

As used herein, "Group III" may refer to Group IIIA and Group IIIB, and examples of Group III metal may be Al, In, Ga, and Tl, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si.

As used herein, "Group V" may refer to Group VA, and examples thereof may include nitrogen, phosphorus, arsenic, antimony, and bismuth, but are not limited thereto.

As used herein, "Group VI" may refer to Group VIA, and examples thereof may include sulfur, selenium, and tellurium, but are not limited thereto.

As used herein, when a definition is not otherwise provided, "substituted" refers to replacement of hydrogen of a compound or the corresponding moiety by a substituent such as a C1 to C30 alkyl group, a C1 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —C, —Br, or —I), a hydroxy group (—OH), a nitro group (—NO$_2$), a cyano group (—CN), an amine or amino group (—NRR' wherein R and R' are independently hydrogen or a C1 to C6 alkyl group), an azido group (—N$_3$), an amidino group (—C(=NH)NH$_2$)), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

Herein, "hydrocarbon" refers to a group including carbon and hydrogen (e.g., an alkyl, alkenyl, alkynyl, or aryl group). The hydrocarbon group may be a group having a monovalence or greater formed by removal of one or more hydrogen atoms from, alkane, alkene, alkyne, or arene. In the hydrocarbon group, at least one methylene may be replaced by an oxide moiety, a carbonyl moiety, an ester moiety, —NH—, or a combination thereof.

Herein, "alkyl" refers to a linear or branched saturated monovalent hydrocarbon group (methyl, ethyl hexyl, etc.).

Herein, "alkenyl" refers to a linear or branched monovalent hydrocarbon group having one or more carbon-carbon double bond.

Herein, "alkynyl" refers to a linear or branched monovalent hydrocarbon group having one or more carbon-carbon triple bond.

Herein, "aryl" refers to a group formed by removal of at least one hydrogen from an aromatic group (e.g., a phenyl or naphthyl group).

Herein, "hetero" refers to one including 1 to 3 heteroatoms of N, O, S, Si, P, or a combination thereof.

Quantum dots (hereinafter also referred to as semiconductor nanocrystal particles or semiconductor nanocrystals) may absorb light from an excitation source and emit light corresponding to the band gap energies of the quantum dots. The band gap energies of the quantum dots may vary depending on the sizes, compositions, or a combination thereof of the quantum dots. For example, as size of a quantum dot increases, the quantum dot may have a decreased band gap energy and an increased emission wavelength. Semiconductor nanocrystals may be used as light emitting materials in various fields such as display devices, energy devices, or bioluminescent devices.

Cadmium-free quantum dots that do not include cadmium (or heavy metals such as lead and mercury) have lower electroluminescence properties and stability than quantum dots that include a harmful heavy metal such as cadmium as the main element. However, harmful heavy metals such as cadmium may cause serious environmental and health problems and are regulated elements under the Restriction of Hazardous Substances Directive (RoHS) in many countries. Development of cadmium-based quantum dots having desired electroluminescence properties (desired emission wavelength, reduced full width at half maximum (FWHM), improved external quantum efficiency, increased brightness, etc.) and an electronic device including the same is desirable.

Cadmium-free semiconductor nanocrystals may include a Group III-V compound, for example, quantum dots including a compound such as InP in a core and quantum dots including a Group II-VI compound such as a ZnSe compound in a shell. However, semiconductor nanocrystals including InP and ZnSe in a core and a shell, respectively, may not have a large energy offset difference between InP and ZnSe and thus may have a low luminous efficiency compared with that of cadmium-based quantum dots. In order to improve the luminous efficiency, semiconductor nanocrystals may additionally include a semiconductor nanocrystal shell including an outermost layer including, e.g., consisting of, zinc and sulfur having much larger band gap energies than those of zinc and selenium. However, since the outermost ZnS layer of the shell may hinder injection and transfer of electrons due to the large band gap energy, when quantum dots including an outermost ZnS layer are included in a light emitting layer to manufacture an electroluminescent device, a driving voltage of the electroluminescent device may be increased and properties such as external quantum efficiency, brightness, life span, and the like may be decreased. Accordingly, cadmium-free quantum dots having high quantum efficiency and a narrow full width at half maximum (FWHM) and thus excellent light emitting characteristics and in addition, capable of accomplishing, e.g., exhibiting, high external quantum efficiency, brightness, and long life span when applied to, e.g., used in, a light emitting layer are desired.

The present inventors surprisingly found out that a lattice strain between the core and the shell may be reduced by doping a cadmium-free quantum dot having a semiconductor nanocrystal core including indium and phosphorus and a semiconductor nanocrystal shell disposed on the semiconductor nanocrystal core and including zinc and selenium with a metal having a larger ion radius than that of a zinc ion (Zn) on the semiconductor nanocrystal shell to structurally stabilize the quantum dot and thus increase quantum efficiency and in addition, decrease a full width at half maximum (FWHM) of an emission peak.

That is, the quantum dot according to an embodiment includes a semiconductor nanocrystal core including indium (In) and phosphorus (P), and a semiconductor nanocrystal shell disposed on the semiconductor nanocrystal core and including zinc (Zn) and selenium (Se), wherein the quantum dot does not include cadmium, the semiconductor nanocrystal shell is doped with a metal having a larger ion radius than that of an $Zn^{2+}$ ion and the quantum dot has a quantum efficiency of greater than or equal to about 70% and a full width at half maximum (FWHM) of an emission peak of less than or equal to about 40 nm.

The quantum dots according to an embodiment may be structurally stable and exhibit high quantum efficiency without including a semiconductor nanocrystal shell including an outermost layer including, e.g., consisting of, zinc and sulfur. In addition, since the electroluminescent device manufactured by including the quantum dots in the light emitting layer does not include a semiconductor nanocrystal shell including an outermost layer including, e.g., consisting of, zinc and sulfur having a large band gap energy, electroluminescent properties such as external quantum efficiency, brightness, and life span may be improved.

Figure 1B:
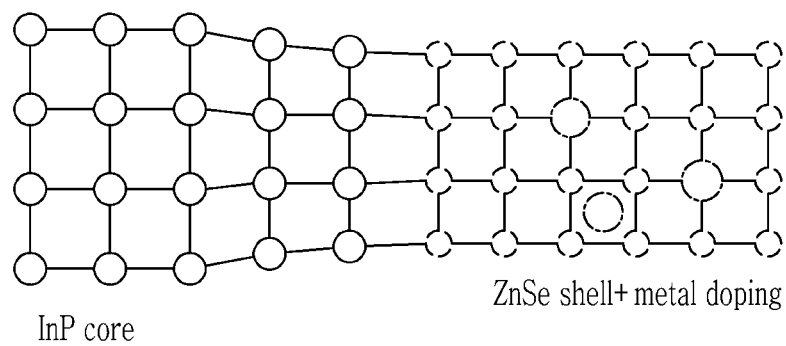
FIG. 1B is a partial cross-sectional view schematically showing a lattice shape of a core and a shell of a quantum dot including, e.g., consisting of, a semiconductor nanocrystal core including indium and phosphorus and a semiconductor nanocrystal shell including zinc and selenium, according to an embodiment, wherein the shell is doped with a metal.

FIG. 1 is a schematic view showing a principle of reducing lattice strain between a core and a shell of a quantum dot according to an embodiment. Specifically, FIG. 1A is a partial cross-sectional view schematically showing a lattice shape of a core and a shell of a quantum dot including a semiconductor nanocrystal core including indium and phosphorus and a semiconductor nanocrystal shell including zinc and selenium which is formed on the core, and FIG. 1B is a partial cross-sectional view schematically showing a lattice shape of a core and a shell of a quantum dot including a semiconductor nanocrystal core including indium and phosphorus and a semiconductor nanocrystal shell including zinc and selenium which is formed on the core wherein the shell is doped with a metal having a larger ion radius than that of a zinc ion ($Zn^{2+}$) according to an embodiment.

Referring to FIG. 1A, the semiconductor nanocrystal core including InP and the semiconductor nanocrystal shell including ZnSe have a large difference in lattice shape or size from each other, and accordingly, a lattice change among semiconductor nanocrystals forming the core and the shell appears on the interface of the core and the shell. This quantum dot may be structurally unstable due to the large lattice strain and exhibit low quantum efficiency.

Referring to FIG. 1B, as the metal having a larger ion radius than that of a $Zn^{2+}$ ion is doped on the ZnSe semiconductor nanocrystal shell, the lattice of ZnSe is much smaller than that of the InP nanocrystal but is increased. Accordingly, the lattice strain is decreased on the interface between the semiconductor nanocrystal core and the shell. Accordingly, the quantum dot according to an embodiment may have a more stabilized structure due to the decreased lattice strain and thus accomplish, e.g., exhibit, higher quantum efficiency.

The quantum dot according to an embodiment may become structurally stable due to the decreased strain between the core and the shell and thus exhibit high quantum efficiency. The quantum dot according to an embodiment may not include a shell including an outermost ZnS layer, which may be included to increase quantum efficiency of a quantum dot having an InP core and a ZnSe shell and low structural stability and low quantum efficiency. The outermost ZnS layer of the shell may have a much larger band gap energy than that of ZnSe and thus a larger energy offset difference from that of the InP core and accordingly, the outermost ZnS layer of the shell may have an effect of increasing quantum efficiency of the quantum dot. However, the large band gap energy of ZnS, when the corresponding quantum dot is applied to, e.g., used in, a light emitting layer of an electroluminescent device, may hinder electron injection and transfer into the quantum dot and reduce electroluminescence properties of the electroluminescent device. The quantum dot according to an embodiment may not include a ZnS shell, e.g., layer, having high quantum efficiency and when included in a light emitting layer of an electroluminescent device, may exhibit an excellent effect of exhibiting high electroluminescence properties. A quantum dot including an InP core and a ZnSe shell but not including an outermost ZnS shell, e.g., layer, may exhibit very low quantum efficiency.

In addition, when the shell has a predetermined thickness, for example, greater than or equal to about 2 nm, the lattice strain between the core and the shell of the quantum dot may be increased, but the lattice strain greatly decreases in the case in which a metal having a larger ion radius than that of a $Zn^{2+}$ ion is doped on the shell, thereby increasing quantum dot efficiency. As shown from the following examples, when a ZnSe shell having a thickness of about 6 monolayers, that is, about 1.8 nm, is doped with the metal, the corresponding quantum dot may show, e.g., exhibit, lower quantum efficiency than that of a quantum dot including an outermost ZnS layer of the shell without the metal doping. However, when the ZnSe shell has a thickness of about 9 monolayers (ML: monolayer) (about 2.8 nm) or greater, the quantum dot may have a lower quantum efficiency, but the quantum dot according to an embodiment exhibits higher (greater than or equal to 90%) quantum efficiency. Accordingly, in the quantum dots according to an embodiment, a thickness of the semiconductor nanocrystal shell including zinc and selenium may be greater than or equal to about 2 nm, for example, greater than or equal to about 2.3 nm, greater than or equal to about 2.5 nm, greater than or equal to about 2.8 nm, greater than or equal to about 3 nm, greater than or equal to about 3.3 nm, greater than or equal to about 3.5 nm, greater than or equal to about 3.7 nm, greater than or equal to about 4 nm, or greater than or equal to about 4.5 nm, and, for example, the thickness of the semiconductor nanocrystal shell may be less than or equal to about 10 nm, less than or equal to about 9 nm, less than or equal to about 8 nm, less than or equal to about 7.5 nm, less than or equal to about 7 nm, less than or equal to about 6.5 nm, or less than or equal to about 6 nm, but is not limited thereto.

The doped metal may be a non-light emitting metal. Herein, "non-light emitting" means a metal that does not change an emission wavelength of the quantum dots, even if the metal is doped, e.g., into the quantum dot.

The metal doped into the semiconductor nanocrystal shell, e.g., the dopant metal, is a metal having a larger ion radius than that of zinc, which is included in the shell of the quantum dot. Examples of such metals may be sodium (Na), calcium (Ca), potassium (K), zirconium (Zr), yttrium (Y), strontium (Sr), samarium (Sm), europium (Eu), or a combination thereof, but are not limited to. While not wanting to be bound by theory, it is understood that when the ion radius of the doped metal is larger than the ion radius of the zinc ion, the doped metal has an effect of increasing the lattice shape or size of the ZnSe semiconductor nanocrystal shell. The ion radii of the zinc ion, the selenium ion, and metals capable of doping into a semiconductor nanocrystal shell including zinc and indium of quantum dots according to an embodiment are shown in Table 1.

TABLE 1

| Metal ion | Radius (nm) |
|---|---|
| $In^{3+}$ | 0.081 |
| $Zn^{2+}$ | 0.074 |
| $Na^+$ | 0.095 |
| $Ca^{2+}$ | 0.099 |
| $K^+$ | 0.133 |
| $Y^{3+}$ | 0.093 |

TABLE 1-continued

| Metal ion | Radius (nm) |
|---|---|
| $Zr^{2+}$ | 0.079 |
| $Sr^{2+}$ | 0.113 |
| $Sm^{3+}$ | 0.096 |
| $Eu^{3+}$ | 0.095 |

For example, the ion radius of the doped metal may be larger than that of the zinc ion by greater than or equal to about 0.001 nm. For example, the ion radius of the doped metal may be larger than the ion radius of the zinc ion by greater than or equal to about 0.002 nm, for example, greater than or equal to about 0.003 nm, greater than or equal to about 0.005 nm, greater than or equal to about 0.007 nm, greater than or equal to about 0.01 nm, greater than or equal to about 0.02 nm, greater than or equal to about 0.03 nm, or greater than or equal to about 0.05 nm, but is not limited thereto. In an embodiment, the doped metal may be sodium, calcium, potassium, or a combination thereof.

In an embodiment, the metal doped into the semiconductor nanocrystal shell may be included in an amount of 0.01 to about 10 moles, for example, about 0.05 to about 5 moles, about 0.1 to about 5 moles, or about 0.1 to about 4 moles, based on 100 moles of the semiconductor nanocrystal forming the semiconductor nanocrystal shell. When the amount of dopant metal is within the disclosed ranges, the lattice strain of the semiconductor nanocrystal shell and the semiconductor nanocrystal core of the quantum dot according to an embodiment may be significantly reduced.

As described herein, the quantum dots according to an embodiment does not include a semiconductor nanocrystal shell including an outermost layer including, e.g., consisting of, zinc and sulfur, and the semiconductor nanocrystal shell including zinc and selenium may not include sulfur. For example, the semiconductor nanocrystal shell may include, e.g., consist of, zinc and selenium.

The core in the quantum dots according to an embodiment may include, e.g., consist of, indium and phosphorus, or may further include zinc in addition to indium and phosphorus.

When the quantum dots according to an embodiment include, e.g., consist of, indium and phosphorus, the quantum dots may emit red light having a peak emission wavelength in the range of about 600 nm to about 650 nm. For example, the peak emission wavelength of the quantum dots may be in a range of about 610 nm to about 640 nm, for example, about 615 nm to about 635 nm, about 620 nm to about 635 nm, or about 620 nm to about 630 nm, but is not limited thereto.

When the quantum dots according to an embodiment include indium, phosphorus, and zinc, the quantum dots may emit green light having a peak emission wavelength in the range of about 480 nm to about 540 nm. For example, the peak emission wavelength of the quantum dots may be in a range of about 490 nm to about 540 nm, for example, about 500 nm to about 540 nm, about 510 nm to about 535 nm, or about 520 nm to about 530 nm, but is not limited thereto.

A mole ratio of phosphorus relative to indium in the quantum dots according to an embodiment may be greater than or equal to about 0.7:1. For example, the mole ratio of phosphorus relative to indium may be greater than or equal to about 0.75:1, greater than or equal to about 0.8:1, or greater than or equal to about 0.9:1, and less than or equal to about 1:1. For example, the mole ratio of phosphorus relative to indium in the quantum dots according to an embodiment may be in a range of about 0.70:1 to about 1.0:1, for example, about 0.75:1 to about 1.0:1, about 0.80:1 to about 1.0:1, about 0.85:1 to about 1.0:1, or about 0.90:1 to about 1.0:1, but is not limited thereto.

A mole ratio of zinc relative to indium in the quantum dot according to an embodiment may be greater than or equal to about 10:1, for example, greater than or equal to about 11:1, greater than or equal to about 13:1, greater than or equal to about 15:1, greater than or equal to about 17:1, greater than or equal to about 20:1, greater than or equal to about 25:1, greater than or equal to about 30:1, greater than or equal to about 35:1, greater than or equal to about 40:1, or greater than or equal to about 45:1. In addition, the mole ratio may be less than or equal to about 70:1, less than or equal to about 60:1, less than or equal to about 50:1, less than or equal to about 49:1, less than or equal to about 45:1, less than or equal to about 40:1, or less than or equal to about 35:1, but is not limited thereto.

A mole ratio of selenium relative to indium of the quantum dots according to an embodiment may be greater than or equal to about 10:1, for example, greater than or equal to about 11:1, greater than or equal to about 13:1, greater than or equal to about 15:1, greater than or equal to about 17:1, greater than or equal to about 20:1, greater than or equal to about 25:1, greater than or equal to about 30:1, greater than or equal to about 35:1, greater than or equal to about 40:1, or greater than or equal to about 45:1 and, for example, less than or equal to about 70:1, less than or equal to about 60:1, less than or equal to about 50:1, less than or equal to about 47:1, less than or equal to about 45:1, less than or equal to about 40:1, less than or equal to about 35:1, less than or equal to about 30:1, less than or equal to about 25:1, or less than or equal to about 20:1, but is not limited thereto.

The quantum dots according to an embodiment may have a particle size, e.g., an average particle size, of greater than or equal to about 8 nm. For example, the quantum dot may have an average particle size of greater than or equal to about 9 nm, or greater than or equal to about 10 nm. The average size of the quantum dot may be less than or equal to about 50 nm, less than or equal to about 45 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, less than or equal to about 28 nm, less than or equal to about 27 nm, less than or equal to about 26 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, or less than or equal to about 13 nm, but is not limited thereto.

The size of the quantum dots may be a particle diameter. If the quantum dots do not have a spherical shape, the sizes of the quantum dots may be a diameter calculated by converting a two-dimensional area identified by transmission electron microscopy to a circle. The average may be "mean" or "median."

A size of the core of the quantum dots may be appropriately selected taking into consideration the peak emission wavelength. For example, the size of the core may be greater than or equal to about 1 nm, greater than or equal to about 1.5 nm, greater than or equal to about 2 nm, or greater than or equal to about 2.5 nm and, for example, the size of the core may be less than or equal to about 5 nm, less than or equal to about 4 nm, less than or equal to about 4.5 nm, less than or equal to about 3.5 nm, or less than or equal to about 3 nm.

A shape of the quantum dots is not particularly limited, may, for example, be a spherical, polyhedron, pyramid, multipod, or cube shape, nanotube, nanowire, nanofiber, nanosheet, or a combination thereof, but is not limited thereto.

The quantum dots may include an organic ligand, an organic solvent, or a combination thereof, which will be described herein, on surfaces of the quantum dots. The organic ligand, the organic solvent, or a combination thereof may be bound to surfaces of the quantum dots.

The quantum dots according to an embodiment may be prepared in a method of preparing the semiconductor nanocrystal core; and forming the semiconductor nanocrystal shell on the core, wherein the formation of the semiconductor nanocrystal shell includes doping a metal having a larger ion radius than that of a zinc ion.

The preparation of the semiconductor nanocrystal core may, for example, be performed by reacting a precursor of an indium-containing compound and a precursor of a phosphorous-containing compound to synthesize an InP semiconductor nanocrystal core or using a commercially-available semiconductor nanocrystal core. When the InP semiconductor nanocrystal core is synthesized, the core may be obtained by injecting, e.g., adding, an indium precursor and a phosphorous precursor under presence of an organic ligand, a surfactant, or a combination thereof into an organic solvent heated at a reaction temperature and reacting them. In an embodiment, the core may be formed in a hot injection method of heating the indium precursor and optionally, a ligand-including solution at a high temperature (e.g., greater than or equal to about 200° C.) and then, injecting, e.g., adding, the phosphorous precursor and optionally, a zinc precursor thereinto. When the semiconductor nanocrystal core including indium and phosphorous is obtained through the reaction, the temperature is decreased to complete the reaction, an excess amount of a non-solvent is added thereto to precipitate the semiconductor nanocrystal core, and the semiconductor nanocrystal core is washed and filtered.

The formation of the shell includes heating a first mixture including a zinc-containing precursor, an organic ligand, and an organic solvent at a first temperature; adding the (e.g., unheated) core to the heated first mixture to prepare a second mixture; increasing a temperature of the second mixture to the first reaction temperature, injecting, e.g., adding, a selenium-containing precursor thereinto to prepare a third mixture and reacting them for predetermined time; and increasing a temperature of the third mixture to the second reaction temperature and injecting, e.g., adding, a precursor of a doping metal to prepare a fourth mixture and then, reacting them. The method may further include adding a zinc-containing precursor, a selenium-containing precursor, or a combination thereof to the fourth mixture.

The type of the indium precursor may be appropriately selected. For example, the indium precursor may include an indium halide, indium nitrate, indium hydroxide, indium fluoride, indium chloride, indium bromide, indium iodide, indium oxide, indium sulfate, indium carboxylate, indium acetate, indium acetylacetonate, or a combination thereof.

The type of the phosphorus precursor may be appropriately selected. For example, the phosphorus precursor may include tris(trimethylsilyl) phosphine, tris(dimethylamino) phosphine, triethylphosphine, tributylphosphine, trioctylphosphine, triphenylphosphine, tricyclohexylphosphine, or a combination thereof.

For example, the zinc precursor may be a Zn metal powder, an alkylated Zn compound, a Zn alkoxide, a Zn carboxylate, Zn nitrate, Zn chlorate, Zn sulfate, Zn acetylacetonate, a Zn halide, Zn cyanide, Zn hydroxide, Zn oxide, Zn peroxide, or a combination thereof. For example, examples of the zinc precursor may be dimethylzinc, diethylzinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, and the like. Two or more different zinc precursors may be used.

The type of the selenium precursor is not particularly limited and may be appropriately selected. For example, the selenium precursor may be selenium, selenium-trioctylphosphine (Se-TOP), selenium-tributylphosphine (Se-TBP), selenium-triphenylphosphine (Se-TPP), tellurium-tributylphosphine (Te-TBP), or a combination thereof, but is not limited thereto.

The precursor of the doped metal may be a powder of a doped metal, an oxide of a doped metal, a hydroxide of a doped metal, a halide of a doped metal, an alkoxide of a doped metal, a cyanide of a doped metal, a peroxide of a doped metal, acetylacetonate of a doped metal, and the like, but is not limited thereto.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, $R_2POOH$ (wherein, R and R' are each independently a C1 to C24 aliphatic hydrocarbon (e.g., a C1 to C24 alkyl group, a C2 to C24 alkenyl group, a C2 to C24 alkynyl group), a C6 to C20 aromatic hydrocarbon (e.g., a C6 to C20 aryl group)), or a combination thereof.

The organic ligand may coordinate, e.g., bind to, the surface of the obtained nanocrystal and may aid with dispersion of the semiconductor nanocrystal in the solution, have an effect on light emitting and electrical characteristics of quantum dots, or a combination hereof. Examples of the organic ligand may include methane thiol, ethane thiol, propane thiol, butane thiol, pentane thiol, hexane thiol, octane thiol, dodecane thiol, hexadecane thiol, octadecane thiol, or benzyl thiol; methane amine, ethane amine, propane amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine such as a substituted or unsubstituted methyl phosphine (e.g., trimethyl phosphine, methyldiphenyl phosphine, etc.), a substituted or unsubstituted ethyl phosphine (e.g., triethyl phosphine, ethyldiphenyl phosphine, etc.), a substituted or unsubstituted propyl phosphine, a substituted or unsubstituted butyl phosphine, a substituted or unsubstituted pentyl phosphine, or a substituted or unsubstituted octylphosphine (e.g., trioctylphosphine (TOP)); a phosphine oxide such as a substituted or unsubstituted methyl phosphine oxide (e.g., trimethyl phosphine oxide, methyldiphenyl phosphine oxide, etc.), a substituted or unsubstituted ethyl phosphine oxide (e.g., triethyl phosphine oxide, ethyldiphenyl phosphine oxide, etc.), a substituted or unsubstituted propyl phosphine oxide, a substituted or unsubstituted butyl phosphine oxide, or a substituted or unsubstituted octyl phosphine oxide (e.g., trioctylphosphine oxide (TOPO); diphenyl phosphine, a triphenyl phosphine, or an oxide compound thereof; phosphonic acid and the like, but are not limited thereto. Two or more different organic ligands may be used.

The solvent may be a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenyl hexadecane; a phosphine substituted with a C6 to C22 alkyl group such as trioctylphosphine; a phosphine oxide substituted with a C6 to C22 alkyl group such as trioctylphosphine oxide; a C12 to C22 aromatic ether such as phenyl ether, or benzyl ether, or a combination thereof. The type and the content of the solvent may be appropriately selected talking into consideration types and amounts of the used precursors and organic ligands.

After the completion of the reaction, when the nonsolvent is added to the reaction product, the semiconductor nanocrystal particles coordinated with, e.g., bound to, the ligand compound may be separated. The nonsolvent may be a polar solvent that is miscible with the solvent used in the core formation reaction, shell formation reaction, or a combination thereof and may not be capable of dispersing the produced semiconductor nanocrystals therein. The nonsolvent may be selected depending on the solvent used in the reaction and may be, for example, acetone, ethanol, butanol, isopropanol, ethanediol, water, tetrahydrofuran (THF), dimethylsulfoxide (DMSO), diethylether, formaldehyde, acetaldehyde, ethylene glycol, a solvent having a similar solubility parameter to the foregoing solvents, or a combination thereof. The separation may use centrifugation, precipitation, chromatography, distillation, or a combination thereof. The separated semiconductor nanocrystals may be washed by adding them to a washing solvent as desired. The washing solvent is not particularly limited, and a solvent having a solubility parameter similar to the ligand may be used. Examples thereof may include hexane, heptane, octane, chloroform, toluene, and benzene.

The quantum dots of an embodiment may be non-dispersible or non-water soluble for water, the aforementioned nonsolvent, or a combination thereof.

The quantum dots of an embodiment may be dispersed in the aforementioned organic solvent. In an embodiment, the aforementioned quantum dots may be dispersed in a C6 to C40 aliphatic hydrocarbon, a C6 to C40 substituted or unsubstituted aromatic hydrocarbon, or a combination thereof.

In the reaction system, by adjusting amounts between the zinc-containing precursor, the selenium-containing precursor, and the doped metal precursor relative to the core, and optionally, for example, the injection amounts of the precursors, injection/reaction temperatures, reaction times, or a combination thereof, the quantum dots according to an embodiment may exhibit desired sizes, compositions, and physical properties.

The quantum dots according to an embodiment may have a quantum efficiency of greater than or equal to about 70%, for example, greater than or equal to about 80%, greater than or equal to about 85%, greater than or equal to about 88%, or greater than or equal to about 90% and a full width at half maximum (FWHM) of an emission peak of less than or equal to about 40 nm, less than or equal to about 39 nm, less than or equal to about 38 nm, or less than or equal to about 37 nm, but are not limited thereto.

The quantum dots according to an embodiment may have a high quantum efficiency and a low, e.g., narrow, full width at half maximum (FWHM) as described herein, and thus may be included in a light emitting layer of an electroluminescent device. Accordingly, an embodiment provides an electronic device including the quantum dots according to an embodiment. For example, the electronic device may be a light emitting device (e.g., a lighting such as a quantum dot sheet or a quantum dot rail, a liquid crystal display device, etc.) or an electroluminescent device (e.g., QD LED).

In an embodiment, the electronic device may include a quantum dot sheet and the aforementioned semiconductor nanocrystal particle may be included in the quantum dot sheet (e.g., in a form of a semiconductor nanocrystal-polymer composite).

Figure 2:
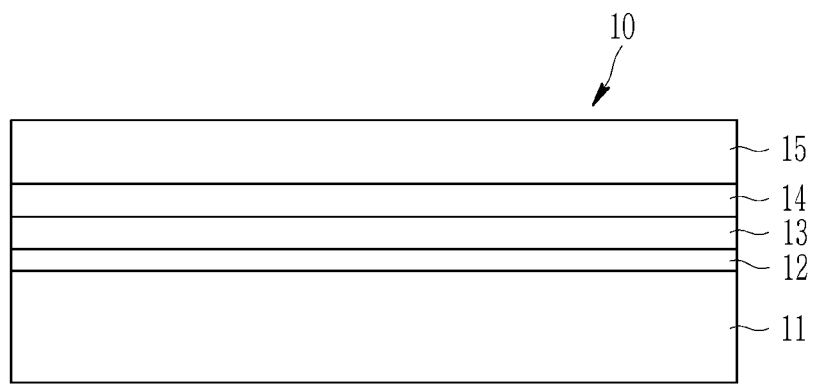
FIG. 2 is a schematic cross-sectional view of a quantum dot (QD) light emitting diode (LED_device according to an embodiment.

In an embodiment, the electronic device may be an electroluminescent device. Referring to FIG. 2, the electroluminescent device 10 according to an embodiment includes a first electrode 11 and a second electrode 15 facing each other and a light emitting layer 13 disposed between the first electrode 11 and the second electrode 15 and including a plurality of quantum dots. A hole auxiliary layer 12 may be provided between the first electrode 11 and the light emitting layer 13. An electronic auxiliary layer 14 may be provided between the second electrode 15 and the light emitting layer 13.

The light emitting device may further include a substrate (not shown). The substrate may be disposed at the side of the first electrode 11 or the second electrode 15. In an embodiment, the substrate may be disposed at the side of the first electrode. The substrate may be a substrate including an insulation material (e.g., an insulating transparent substrate). The substrate may include glass; a polymer such as a polyester (e.g., polyethyleneterephthalate (PET), polyethylenenaphthalate (PEN)), a polycarbonate, a polyacrylate, a polyimide, or a polyamideimide; a polysiloxane (e.g., polydimethylsiloxane (PDMS)); an inorganic material such as $Al_2O_3$, ZnO, or a combination thereof; or a combination thereof, but is not limited thereto. The substrate may be made of a silicon wafer, and the like. Herein, "transparent" refers to transmittance for light in a predetermined wavelength (e.g., light emitted from the quantum dots) of greater than or equal to about 85%, greater than or equal to about 88%, greater than or equal to about 90%, greater than or equal to about 95%, greater than or equal to about 97%, or greater than or equal to about 99%. A thickness of the substrate may be appropriately selected taking into consideration a substrate material, and the like, but is not particularly limited. The transparent substrate may have flexibility. The substrate may be omitted.

The first electrode 11 or the second electrode 15 may be an anode and the other may be a cathode. For example, the first electrode 11 may be an anode and the second electrode 15 may be a cathode.

The first electrode 11 may be made of a conductor, for example, a metal, a conductive metal oxide, or a combination thereof. The first electrode 11 may be, for example, made of a metal such as nickel, platinum, vanadium, chromium, copper, zinc, gold, or an alloy thereof; a conductive metal oxide such as zinc oxide, indium oxide, tin oxide, indium tin oxide (ITO), indium zinc oxide (IZO), or fluorine doped tin oxide; or a combination of a metal and an oxide such as ZnO and Al or $SnO_2$ and Sb, but is not limited thereto. In an embodiment, the first electrode may include a transparent conductive metal oxide, for example, indium tin oxide. A work function of the first electrode may be higher than a work function of the second electrode as described herein. A work function of the first electrode may be lower than a work function of the second electrode as described herein.

The second electrode 15 may be made of a conductor, for example, a metal, a conductive metal oxide, a conductive polymer, or a combination thereof. The second electrode 15 may be, for example, made of a metal such as aluminum, magnesium, calcium, sodium, potassium, titanium, indium, yttrium, lithium, gadolinium silver, gold, platinum, tin, lead, cesium, barium, or an alloy thereof; a multi-layered structure material such as LiF/Al, lithium oxide ($Li_2O$)/Al, 8-hydroxyquinolinolato-lithium (Liq)/Al, LiF/Ca, and $BaF_2$/Ca, but is not limited thereto. The conductive metal oxide is the same as described herein.

In an embodiment, the work function of the first electrode 11 and the second electrode is not particularly limited, and may be appropriately selected. A work function of the first electrode may be higher than a work function of the second electrode. The work function of the first electrode may be lower than the work function of the second electrode.

The first electrode 11, the second electrode 15, or a combination thereof may be a light-transmitting electrode, and the light-transmitting electrode may be, for example, made of a conductive oxide such as zinc oxide, indium oxide, tin oxide, indium tin oxide (ITO), indium zinc oxide (IZO), or fluorine doped tin oxide, or a thin metal layer, for example, a single layer or a multilayer. When the first electrode 11 or the second electrode 15 is a non-light-transmitting electrode, the non-light-transmitting electrode may be made of, for example, an opaque conductor such as aluminum (Al), silver (Ag), or gold (Au).

The thickness of the electrode (first electrode, second electrode, or a combination thereof) is not particularly limited, and may be appropriately selected taking into consideration device efficiency. For example, the thickness of the electrodes may be greater than or equal to about 5 nm, or greater than or equal to about 50 nm. For example, the thickness of the electrodes may be less than or equal to about 100 micrometers (μm), less than or equal to about 10 μm, less than or equal to about 1 μm, less than or equal to about 900 nm, less than or equal to about 500 nm, or less than or equal to about 100 nm.

The light emitting layer 13 includes (e.g., a plurality of) quantum dots. The plurality of quantum dots may include the aforementioned quantum dots according to an embodiment. In an embodiment, the light emitting layer 13 may include a monolayer of quantum dots. In an embodiment, the light emitting layer 13 includes one or more, two (2) or more, three (3) or more, or four (4) or more and twenty (20) or less, ten (10) or less, nine (9) or less, eight (8) or less, seven (7) or less, or six (6) or less monolayers of quantum dots. The light emitting layer 13 may have a thickness of greater than or equal to about 5 nm, greater than or equal to about 10 nm, greater than or equal to about 20 nm, or greater than or equal to about 30 nm and less than or equal to about 200 nm, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The light emitting layer 13 may have, for example, a thickness of about 10 nm to about 150 nm, for example, about 10 nm to about 100 nm, or about 10 nm to about 50 nm.

The light emitting device according to the embodiment may further include a hole auxiliary layer. The hole auxiliary layer 12 may be disposed between the first electrode 11 and the light emitting layer 13. The hole auxiliary layer 12 may include a hole injection layer, a hole transport layer, an electron (or hole) blocking layer, or a combination hereof. The hole auxiliary layer 12 may be a single-component layer or a multilayer structure in which adjacent layers include different components.

The HOMO energy level of the hole auxiliary layer 12 has a HOMO energy level that may be matched with the HOMO energy level of the light emitting layer 13 in order to enhance mobility of holes transferred from the hole auxiliary layer 12 to the light emitting layer 13. In an embodiment, the hole auxiliary layer 12 may include a hole injection layer disposed close to the first electrode 11 and a hole transport layer disposed close to the light emitting layer 13.

Materials included in the hole auxiliary layer 12 (e.g., a hole transport layer or a hole injection layer) are not particularly limited, but may, for example, include poly(9,9-dioctyl-fluorene-co-N-(4-butylphenyl)-diphenylamine) (TFB), polyarylamine, poly(N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis (4-methoxyphenyl)-benzidine (TPD), 4-bis[N-(1-naphthyl)-N-phenyl-amino] biphenyl (α-NPD), 4,4',4"-tris[phenyl(m-tolyl)amino] triphenylamine (m-MTDATA), 4,4',4"-tris(N-carbazolyl)-triphenylamine (TCTA), 1,1-bis[(di-4-tolylamino) phenylcyclohexane (TAPC), a p-type metal oxide (e.g., NiO, $WO_3$, $MoO_3$, etc.), a carbon-based material such as graphene oxide, or a combination thereof, but are not limited thereto.

The electron blocking layer (EBL) may include, for example, poly(3,4-ethylenedioxythiophene):poly(styrene-sulfonate) (PEDOT:PSS), poly(9,9-dioctyl-fluorene-co-N-(4-butylphenyl)-diphenylamine) (TFB) polyarylamine, poly (N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), or a combination thereof, but is not limited thereto.

In the hole auxiliary layer(s), a thickness of each layer may be appropriately selected. For example, the thickness of each layer may be greater than or equal to about 5 nm, greater than or equal to about 10 nm, greater than or equal to about 15 nm, or greater than or equal to about 20 nm and less than or equal to about 50 nm, less than or equal to about 40 nm, less than or equal to about 35 nm, or less than or equal to about 30 nm, but is not limited thereto.

The electronic auxiliary layer 14 may be disposed between the light emitting layer 13 and the second electrode 15. The electron auxiliary layer 14 may include, for example, an electron injection layer, an electron transport layer, a hole (or electron) blocking layer, or a combination thereof. The electron auxiliary layer may be, for example, an electron injection layer (EIL) that facilitates electron injection, an electron transport layer (ETL) that facilitates electron transport, or a hole blocking layer (HBL) that blocks hole movement, or a combination thereof. For example, an electron injection layer may be disposed between the electron transport layer and the cathode. For example, the hole blocking layer may be disposed between the light emitting layer and the electron transport (injection) layer, but is not limited thereto. The thickness of each layer may be appropriately selected. For example, the thickness of each layer may be greater than or equal to about 1 nm and less than or equal to about 500 nm, but is not limited thereto. The electron injection layer may be an organic layer formed by vapor deposition. The electron transport layer may include inorganic oxide nanoparticles, or may be an organic layer formed by vapor deposition.

The electron transport layer (ETL) may include, for example, 1,4,5,8-naphthalene-tetracarboxylic dianhydride (NTCDA), bathocuproine (BCP), tris[3-(3-pyridyl)-mesityl]borane (3TPYMB), LiF, tris(8-hydroxyquinolinato)aluminum ($Alq_3$), tris(8-hydroxyquinolinato)gallium ($Gaq_3$), tris(8-hydroxyquinolinato)indium ($Inq_3$), bis(8-hydroxyquinoline) zinc ($Znq_2$), bis(2-(2-hydroxyphenyl)benzothiazolate) zinc ($Zn(BTZ)_2$), bis(10-hydroxybenzo[h]quinolinato)beryllium ($BeBq_2$), 8-(4-(4,6-di(naphthalen-2-yl)-1,3,5-triazin-2-yl)phenyl)quinolone (ET204), 8-hydroxyquinolinato lithium (Liq), an n-type metal oxide (e.g., ZnO, $HfO_2$, etc.), or a combination thereof, but is not limited thereto.

The hole blocking layer (HBL) may include, for example, 1,4,5,8-naphthalene-tetracarboxylic dianhydride (NTCDA), bathocuproine (BCP), tris[3-(3-pyridyl)-mesityl]borane (3TPYMB), LiF, $Alq_3$, Gaq3, Inq3, Znq2, $Zn(BTZ)_2$, $BeBq_2$, or a combination thereof, but is not limited thereto.

The electron auxiliary layer 14 may include an electron transport layer. The electron transport layer may include a plurality of nanoparticles. The nanoparticles may include a metal oxide including zinc. The metal oxide may include zinc oxide, zinc magnesium oxide, or a combination thereof. The metal oxide may include $Zn_{1-x}M_xO$ (wherein, M is Mg, Ca, Zr, W, Li, Ti, Y, Al, or a combination thereof, and $0 \leq x \leq 0.5$). In an embodiment, M in the chemical formula may be magnesium (Mg). In an embodiment, in the chemical formula, x may be greater than or equal to about 0.01 and less than or equal to about 0.3, less than or equal to about 0.25, less than or equal to about 0.2, or less than or equal to about 0.15. An absolute value of LUMO of the aforementioned quantum dots included in the light emitting layer may be smaller than an absolute value of LUMO of the metal oxide. An average size of the nanoparticles may be greater than or equal to about 1 nm, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm. The nanoparticles may not be rod-shaped. The nanoparticles may not be in the form of nanowires.

In an embodiment, each thickness of the electron auxiliary layer 14 (e.g., electron injection layer, electron transport layer, or hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about nm, less than or equal to about 30 nm, or less than or equal to about 25 nm, but is not limited thereto.

Figure 3:
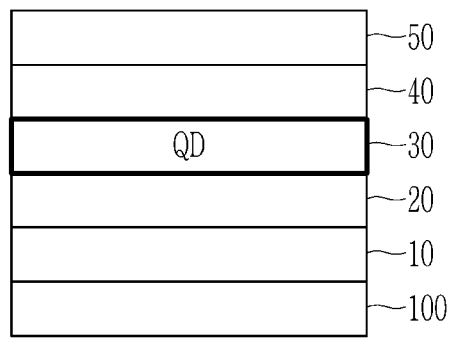
FIG. 3 is a schematic cross-sectional view of a QD LED device according to an embodiment.

Referring to FIG. 3, a device according to an embodiment may have a normal, e.g., non-inverted, structure. In an embodiment, in the device 30, an anode 10 disposed on a transparent substrate 100 may include a metal oxide-based transparent electrode (e.g., ITO electrode) and a cathode 50 facing the anode 10 may include a conductive metal (e.g., Mg, Al Ag, or a combination thereof) (e.g., having a relatively low work function). A hole auxiliary layer 20 (e.g., a hole injection layer of, for example, PEDOT:PSS, a p-type metal oxide, or a combination thereof; a hole transport layer of TFB, poly(9-vinylcarbazole) (PVK), or a combination thereof; or a combination thereof) may be disposed between the transparent electrode 10 and the light emitting layer 30. The hole injection layer may be near, e.g., closer, to the transparent electrode and the hole transport layer may be near, e.g., closer, to the light emitting layer. An electron auxiliary layer 40 such as an electron injection layer/transport layer may be disposed between the quantum dot light emitting layer 30 and the cathode 50.

Figure 4:
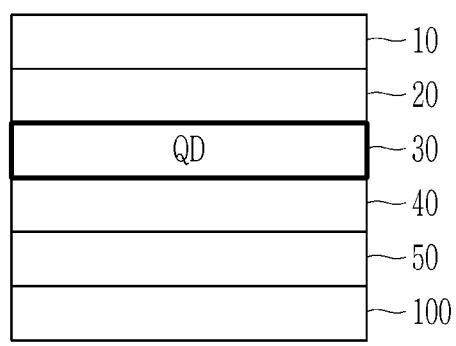
FIG. 4 is a schematic cross-sectional view of a QD LED device according to an embodiment.

Referring to FIG. 4, a device according to an embodiment may have an inverted structure. A cathode 50 disposed on the transparent substrate 100 may include a metal oxide-based transparent electrode (e.g., ITO) and an anode 10 facing the cathode may include a metal (Au, Ag, Mg, etc.) (e.g., having a relatively high work function). For example, a (optionally doped) n-type metal oxide (crystalline Zn metal oxide) may be disposed between the transparent electrode 50 and the light emitting layer 30 as an electron auxiliary layer (e.g., electron transport layer) 40. $MoO_3$ or an other p-type metal oxide may be disposed between the metal anode 10 and the quantum dot light emitting layer 30 as a hole auxiliary layer (e.g., a hole transport layer including TFB; a hole injection layer including PVK, $MoO_3$ or an other p-type metal oxide, or a combination thereof; or a combination thereof) 20.

The aforementioned device may be manufactured by an appropriate method. For example, the electroluminescent device may be manufactured by forming a hole auxiliary layer (e.g., by vapor deposition or coating) on a substrate on which an electrode is formed, forming a light emitting layer including quantum dots (e.g., a pattern of the aforementioned quantum dots), forming (an electron auxiliary layer as desired and) an electrode (e.g., by vapor deposition or coating) on the light emitting layer. The method for forming the electrode/hole auxiliary layer/electron auxiliary layer may be appropriately selected and is not particularly limited.

The formation of the light emitting layer may be performed by preparing a composition including an organic solvent and the quantum dot according to an embodiment and then, applying or depositing it (e.g., spin-coating, Inkjet-printing, contact-printing, and the like) on the substrate or on the charge auxiliary layer. The formation of the light emitting layer may further include heat-treating the applied or deposited quantum dot layer. A temperature for the heat treatment is not particularly limited but may be appropriately selected with consideration of a boiling point of the organic solvent and the like. For example, the heat treatment temperature may be greater than or equal to about 60° C. The type of the organic solvent for the quantum dot composition is not particularly limited but may be appropriately selected. In an embodiment, the organic solvent may include a (substituted or unsubstituted) aliphatic hydrocarbon organic solvent, a (substituted or unsubstituted) aromatic hydrocarbon organic solvent, an acetate solvent, or a combination thereof.

The light emitting layer may be formed by preparing an ink composition including the quantum dot according to an embodiment and a liquid vehicle and then, depositing the ink composition (e.g., through a method such as Inkjet-printing and the like). Accordingly, an embodiment relates to the ink composition including the quantum dot and the liquid vehicle.

The ink composition may further include, optionally, scattering particles, a binder (e.g., having a carboxylic acid group), and various additives (e.g., a monomer having a carbon-carbon double bond, a cross-linking agent, an initiator, and the like). The scattering particles may include $TiO_2$, $SiO_2$, $BaTiO_3$, ZnO, or a combination thereof. The scattering particles may have a size of greater than or equal to about 100 nm and less than or equal to about 1 um.

The liquid vehicle may include an appropriate organic solvent. The organic solvent may include a hydrophilic (or water miscible) organic solvent. The organic solvent may include a hydrophobic organic solvent. The organic solvent may include a polar organic solvent. The organic solvent may include a non-polar organic solvent.

The type and amount of the organic solvent is appropriately determined taking into consideration the type and amount of main components (i.e., quantum dots, dispersants, monomers, initiators, and thiol compounds if present) in the ink composition. Examples of the liquid vehicle may include ethyl 3-ethoxy propionate; an ethylene glycol such as ethylene glycol, diethylene glycol, polyethylene glycol, and the like; a glycol ether such as ethylene glycol monomethyl ether, ethylene glycol monoethyl ether, diethylene glycol monomethyl ether, ethylene glycol diethyl ether, diethylene glycol dimethyl ether, and the like; a glycol ether acetate such as ethylene glycol monomethyl ether acetate, ethylene glycol monoethyl ether acetate, diethylene glycol monoethyl ether acetate, diethylene glycol monobutyl ether acetate, and the like; a propylene glycol such as propylene glycol, and the like; a propylene glycol ether such as propylene glycol monomethyl ether, propylene glycol monoethyl ether, propylene glycol monopropyl ether, propylenemonobutyl ether, propylene glycol dimethyl ether, dipropylene glycol dimethyl ether, propylene glycol diethyl ether, dipropylene glycol diethyl ether, and the like; a propylene glycol ether acetate such as propylene glycol monomethyl ether acetate, dipropylene glycol monoethyl ether acetate, and the like; an amide such as N-methylpyrrolidone, dimethyl formamide, dimethyl acetamide, and the like; a ketone such as methylethylketone (MEK), methylisobutylketone (MIBK), cyclohexanone, and the like; a petroleum such as toluene, xylene, solvent naphtha, and the like; an ester such as ethyl acetate, butyl acetate, ethyl lactate, and the like; an ether such as diethyl ether, dipropyl ether, dibutyl ether, and the like, a (unsubstituted or substituted, for example, halogen-substituted, for example, chloro-substituted) aliphatic, alicyclic, or aromatic hydrocarbon, or a carboxylate/ester derivative (e.g., cyclohexyl acetate, etc.) thereof, or a combination thereof, but is not limited thereto.

The components and concentrations in the ink composition are controlled to appropriately adjust viscosity, and the viscosity is not particularly limited. The viscosity of the ink composition may be about 20 centipoise (cP), less than or equal to about 15 cP, less than or equal to about 10 cP, less than or equal to about 5 cP, less than or equal to about 4 cP, less than or equal to about 3 cP, less than or equal to about 2 cP, or less than or equal to about 1.5 cP. The viscosity of the ink composition may be greater than or equal to about 0.1 cP, greater than or equal to about 0.5 cP, or greater than or equal to about 0.8 cP.

When the quantum dots according to an embodiment is included in a light emitting layer of a device according to an embodiment, a particle size distribution of the corresponding quantum dots, that is, a standard deviation, may be less than or equal to about 20% of the average. In other words, the device according to an embodiment may include a plurality of the quantum dots having a uniform size distribution according to an embodiment show, e.g., present, in the light emitting layer.

When the device of an embodiment includes the quantum dots according to an embodiment in the light emitting layer, electroluminescence properties of the device may be improved. For example, external quantum efficiency (EQE) of the device may be greater than or equal to about 10%, greater than or equal to about 11%, greater than or equal to about 12%, or greater than or equal to about 15%.

In an embodiment, the electroluminescent device may exhibit improved life span characteristics. For example, the electroluminescent device may exhibit a life span T95 of greater than or equal to about 10 hours at 1,000 nits (candelas per square meter), greater than or equal to about 15 hours, greater than or equal to about 20 hours, greater than or equal to about 30 hours, greater than or equal to about 40 hours, greater than or equal to about 50 hours, greater than or equal to about 60 hours, greater than or equal to about 70 hours, greater than or equal to about 80 hours, greater than or equal to about 90 hours, or greater than or equal to about 100 hours. As used herein, life span T95 refers to the time at which the electroluminescent device exhibits 95% brightness compared with 100% initial brightness.

The device of an embodiment may emit red or green light. In an embodiment, the device may emit red light. The red light may have a maximum peak emission wavelength of about 600 nm, greater than or equal to about 610 nm, greater than or equal to about 620 nm, or greater than or equal to about 630 nm and less than or equal to about 690 nm, less than or equal to about 680 nm, less than or equal to about 670 nm, or less than or equal to about 660 nm. An emission peak of the red light may have a full width at half maximum (FWHM) of about 40 nm, less than or equal to about 38 nm, less than or equal to about 37 nm, less than or equal to about 36 nm, or less than or equal to about 35 nm.

Hereinafter, specific embodiments are presented. However, the examples described below are only for specifically illustrating or explaining embodiments, and thus the scope of embodiments should not be limited.

EXAMPLES

Analysis Method

1. Photoluminescence Analysis

Photoluminescence (PL) spectra of the prepared quantum dots are obtained using an irradiation wavelength of 450 nanometers (nm), by using a Hitachi F-7000 spectrometer.

2. Absolute Quantum Efficiency (Quantum Yield) of Quantum Dot

Quantum efficiency is obtained by dividing the number of photons emitted along with photoluminescence from a sample by the number of photons absorbed by the sample. Quantum dot dispersion or a thin film prepared from the dispersion is measured for quantum efficiency using HAMAMATSU-Quantaurus-QY, C11347 (manufacturer: Hamamatsu Corporation).

3. Inductively Coupled Plasma Atomic Emission Spectroscopy (ICP-AES)

Inductively coupled plasma atomic emission spectroscopy (ICP-AES) is performed using Shimadzu ICPS-8100.

4. Electroluminescence Spectroscopy

The electroluminescence properties are evaluated using a Keithley 2635B source meter and a Minolta CS2000 spectroradiometer (current-voltage-brightness measuring instrument). The current, brightness, and electroluminescence (EL) according to the voltage applied to the device are measured through a current-voltage-brightness measuring equipment, from which external quantum efficiency is calculated.

5. Life Span Characteristics

T95(h): When driving the device at 1,000 nits (candelas per square meter ($cd/m^2$)), a time (hours (hr)) at which it takes to achieve 95% brightness compared with 100% initial brightness.

Synthesis is performed in an inert gas atmosphere (under nitrogen flowing conditions) unless otherwise specified.

Synthesis Example 1: Preparation of InP Core

In a 300 milliliter (mL) reaction flask, 0.2 millimoles (mmole) of indium acetate and 0.6 mmole of palmitic acid are dissolved in 1-octadecene and heated at 120° C. under vacuum. Inside of the reactor is substituted with nitrogen. After heating at 280° C., a mixed solution of 0.1 mmole of tris(trimethylsilyl)phosphine (TMS3P) and 1 mL of trioctylphosphine (TOP) is rapidly injected thereto and reacted for 30 minutes. Acetone is added to the reaction solution which has rapidly cooled at a room temperature, and centrifuged to provide a precipitate, and the precipitate is dispersed in toluene again. The obtained InP semiconductor nanocrystal is performed with ultraviolet (UV) spectroscopic photometer, so from the results, it is confirmed that a diameter of the InP core is about 3 nm.

Examples and Comparative Examples

Comparative Example 1: Synthesis of InP/ZnSe/ZnS Quantum Dots and Analysis of Characteristics (1) Se powder and S powder are each dissolved in TOP to prepare a 2 moles per liter (M) Se/TOP stock solution and a 1 M S/TOP stock solution.

(2) Zinc acetate and oleic acid are dissolved into trioctylamine in 200 mL reaction flask and vacuumed, e.g., subjected to vacuum conditions, at 120° C. for 10 minutes. After substituting the inside of the reaction flask with nitrogen ($N_2$), the toluene solution of the InP core synthesized from Synthesis Example 1 is injected while the obtained solution is heated at a temperature of 320° C., and the obtained Se/TOP stock solution is repeatedly injected over several times. By performing the reaction, a reaction solution including particles in which ZnSe shell is disposed on a core is obtained. The total reaction time is about 100 minutes, and the total amount of the used Se with respect to 1 mole of indium is about 8 moles.

Subsequently, a S/TOP stock solution is injected to the reaction solution at the reaction temperature. By performing the reaction, a reaction solution including particles in which a ZnS shell is disposed on the ZnSe shell. The total reaction time is 60 minutes, and the total amount of the used S with respect to 1 mole of indium is about 8 moles. Then the solution is cooled at a room temperature and added with an excess amount of ethanol and then centrifuged to discharge a supernatant, and a precipitate is dried and dispersed in toluene to provide an InP/ZnSe/ZnS quantum dot solution.

(3) The results of performing a photoluminescence analysis of the obtained quantum dot show that an emission peak is 628 nm, a full width at half maximum (FWHM) is 36 nm, and a quantum efficiency is 78%.

(4) In addition, when UV spectrometry of the quantum dot is performed, the ZnSe shell formed right on the core of the quantum dot has a thickness of about 1.7 nm (about 6 ML: a monolayer), and the ZnS shell formed as an outermost layer on the ZnSe shell has a thickness of 0.3 nm is, and the quantum dot has a diameter of about 7.7 nm. Furthermore, as an ICP-AES analysis result, a mole ratio of phosphorous relative to indium in the quantum dot is about 0.89:1, a mole ratio of zinc relative to the indium is 17.6:1, and a mole ratio of selenium relative to the indium is 8:1.

Figure 5:
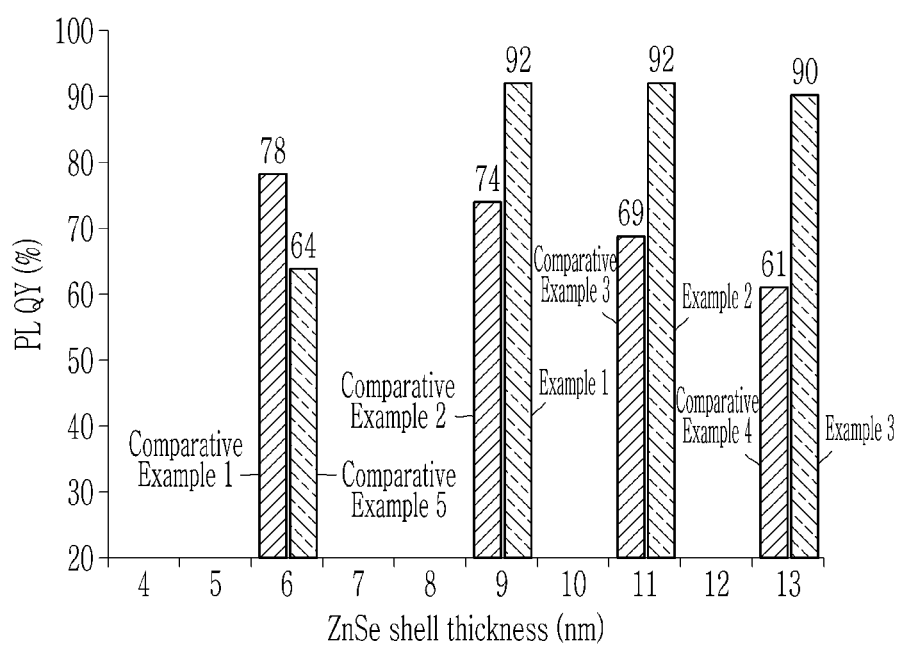
FIG. 5 is a graph of photoluminescence (PL) quantum yield (QY) (percent (%)) versus ZnSe shell thickness (nm) showing changes of quantum efficiency depending on the thickness of the ZnSe shell of the quantum dots of Comparative Examples 1 to 5 and the quantum dots of Examples 1 to 3.

(5) Quantum efficiency versus a shell thickness of the quantum dot along with quantum efficiency versus a ZnSe shell thickness of each quantum dot according to other comparative examples and examples are shown as a graph of FIG. 5.

Comparative Examples 2 to 4: Synthesis of InP/ZnSe/ZnS Quantum Dots and Analysis of Characteristics A quantum dot having a ZnSe shell and a ZnS shell on the core of Synthesis Example 1 is formed according to the same method as Comparative Example 1 except that the ZnSe shell is respectively formed to have a thickness of about 9 ML (about 2.8 nm) (Comparative Example 2), about 11 ML (about 3.5 nm) (Comparative Example 3), and about 13 ML (about 4.3 nm) (Comparative Example 4) by adjusting the contents of zinc acetate and Se/TOP.

As a light emitting analysis result of the obtained quantum dots, emission peaks appear at about 630 nm, and as the thickness of the ZnSe shell increases, the quantum efficiency becomes lower. In other words, the quantum dot of Comparative Example 2 exhibits quantum yield (QY) of about 74%, the quantum dot of Comparative Example 3 exhibits QY of about 69%, and the quantum dot of Comparative Example 4 exhibits QY of about 61%. These quantum dots have a full width at half maximum (FWHM) within a range of about 35 nm to 37 nm.

The ZnS shells of the quantum dots are formed as an outermost layer on the ZnSe shells to have a thickness of 0.3 nm, and the obtained quantum dots respectively have a diameter of 9.5 nm (Comparative Example 2), (10.9 nm (Comparative Example 3), and 12.5 nm (Comparative Example 4).

Quantum efficiency versus the ZnSe shell thicknesses of the quantum dots of Comparative Examples 2 to 4 is shown in a graph of FIG. 5.

Examples 1 to 3: Synthesis of Quantum Dots Having ZnSe Shell Doped With Metal on InP Core and Analysis of Characteristics The quantum dots respectively having sodium-doped ZnSe shells of Examples 1 to 3 are manufactured according to a similar method to that of the Comparative Example 1 except that the InP core of Synthesis Example 1 is respectively doped with a sodium metal in each amount of about 1.5 moles (Examples 1 and 2), and about 3 moles (Example 3) based on 100 moles of the InP core to form each ZnSe nanocrystal shell respectively having a thickness of 9 ML (about 2.8 nm) (Example 1), 11 ML (about 3.5 nm) (Example 2), and about 13 ML (about 4 nm) (Example 3) on the InP core. As for the quantum dots of Examples 1 to 3, on the sodium-doped ZnSe shell, an additional shell, for example, a ZnS shell is not formed.

Quantum efficiency of the quantum dots having the sodium-doped ZnSe shell on the InP core depending on a ZnSe shell thickness is shown in FIG. 5.

As shown in FIG. 5, quantum efficiency of the quantum dots of Comparative Examples 1 to 4 decreases, as the thickness of the ZnSe shell decreases, but as for the quantum dots of Examples 1 to 3, when the ZnSe shell has a thickness of greater than or equal to 2 nm, for example, a thickness of greater than or equal to 2.8 nm as shown in Example 1, efficiency of the quantum dots doped with the metal but not including a ZnS shell are about equal and maintain a high efficiency of greater than or equal to 90%.

The quantum dots respectively have a diameter of 8.9 nm (Example 1), 10.3 nm (Example 2), and 11.9 nm (Example 3), and as a light-emission analysis result, emission peaks appear at about 630 nm, and in addition, the quantum dots have a full width at half maximum (FWHM) of about 35 nm to 37 nm. In other words, quantum efficiency is increased by doping a metal on a semiconductor nanocrystal shell, but a peak emission wavelength or a full width at half maximum (FWHM) are substantially not changed but equally maintained.

Comparative Example 5: Synthesis of Quantum Dots Having ZnSe Shell Doped With Metal on InP Core and Analysis of Characteristics A quantum dot having the InP core and the metal-doped ZnSe shell is manufactured according to the same method as Examples 1 to 3 except that the ZnSe shell has a thickness of 6 monolayers, that is, about 1.8 nm, as shown in Comparative Example 1, without an additional ZnS shell, and quantum efficiency of this quantum dot is measured and then, shown in FIG. 5.

As shown in FIG. 5, when the ZnSe shell is doped with about 1.5 mole of sodium based on 100 moles of In as performed in Examples 1 and 2 but formed to have a thickness of less than 2 nm, that is, 1.8 nm, quantum efficiency of the quantum dot may be lower than that of the quantum dot having the ZnSe shell and the ZnS shell of Comparative Example 1 without metal doping. In other words, when the ZnSe shell has no predetermined thickness or thicker, the lattice strain decrease effect between InP core and ZnSe shell due to the metal doping may not be obtained.

An emission peak of the quantum dot of Comparative Example 5 appears at about 641 nm, a full width at half maximum (FWHM) of an emission peak is 56 nm, and accordingly, light emitting characteristics of the quantum dot are insufficient.

Example 4: Synthesis of Quantum Dots Having ZnSe Shell Doped With Metal on InP Core and ZnS Shell Thereon and Analysis of Characteristics A quantum dot of Example 4 is manufactured to have the metal-doped ZnSe shell according to the same method as Examples 1 to 3 except that the ZnSe shell has a thickness of 11 ML, that is, about 3.5 nm as shown in Example 2, and a ZnS shell having a thickness of 0.3 nm is formed thereon.

The quantum dot of Example 4 has the ZnSe shell doped with a metal and having a thickness of 3.5 nm as shown in Example 2 and thus exhibits similar quantum efficiency of 90% to that of Example 2. In this way, as the quantum dot of Example 4 exhibits similar quantum efficiency to that of the quantum dots of examples, an electroluminescent device including the quantum dot of Example 4 is manufactured in the following experimental example, and light emitting characteristics thereof is compared with those of devices including the quantum dots of examples. The results are described in detail in the following experimental examples.

Experimental Examples: Manufacture of Electroluminescent Device

The quantum dots of Examples 1 and 2 and Comparative Example 2 and Example 4 are respectively used to manufacture electroluminescent devices in the following method:

On a glass substrate deposited with an indium tin oxide (ITO) electrode (an anode), poly(3,4-ethylenedioxythiophene):poly(styrenesulfonate) (PEDOT:PSS) and poly(9,9-dioctyl-fluorene-co-N-(4-butylphenyl)-diphenylamine) (TFB) layers are respectively formed as a hole injection layer (HIL) (about 30 nm) and a hole transport layer (HTL) (about 25 nm) in a spin coating method. On the TFB layer, each octane dispersion of the quantum dots of examples and comparative examples is spin-coated to form a quantum dot light emitting layer (about 25 nm). On the quantum dot light emitting layer, a zinc oxide nanoparticle-based film (a thickness: about 40 nm) as an electron transport layer (ETL) is formed, and an Al (aluminum) electrode is formed thereon through deposition.

The manufactured devices are measured with respect to electroluminescence properties and life span characteristics, and the results are shown in Table 2.

TABLE 2

|  | PL QY (%) | External Quantum Efficiency (EQE) Maximum (%) | Luminance Maximum (cd/m²) | Voltage @ 5 milliamperes (mA) (Volts (V)) | T95 (hr) |
| --- | --- | --- | --- | --- | --- |
| Example 4 | 90 | 7.3 | 58,130 | 3.6 | 9.8 |
| Comparative Example 2 | 75 | 6.7 | 31,140 | 3.5 | 0.5 |
| Example 1 | 92 | 14.4 | 91,690 | 3.0 | 141 |
| Example 2 | 91 | 16.0 | 88,740 | 3.0 | 152 |

Referring to Table 2, the quantum dots of Examples 1 and 2 do not only exhibit much higher quantum efficiency than the quantum dot including the ZnSe shell and the ZnS shell of Comparative Example 2, but when included in a light emitting layer of an electroluminescent device, EQE thereof is increased two times or more and thus increased 10% or greater compared with that of Comparative Example 2, brightness is increased two times or more, a driving voltage is decreased compared with that of Comparative Example 2, and life span characteristics are increased 200 times or more.

The quantum dot having the same metal-doped ZnSe shell as that of Example 2 but including an outermost ZnS shell of Example 4 exhibits similar quantum efficiency of 90% to the quantum efficiencies of Examples 1 and 2, but when included to manufacture the electroluminescent devices, EQE thereof is equivalent to that of Comparative Example 2 but a half of the EQE of Examples 1 and 2, brightness is also higher than that of Comparative Example 2 but lower than the brightness of the devices including the quantum dots of Examples 1 and 2, and a driving voltage is also about equal to that of the device including the quantum dot of Comparative Example 2 due to the outermost ZnS shell. In addition, life span characteristics are higher than life span characteristics of Comparative Example 2 but 10 times or more lower than life span characteristics of the devices including the quantum dots of Examples 1 and 2. In other words, since the quantum dot of Example 4 includes the outermost ZnS shell, electron injection and transfer characteristics are deteriorated, which results in insufficient electroluminescence properties.

When the quantum dots of Examples 1 and 2 showing similar quantum efficiency to the quantum efficiency of the quantum dot of Example 4 are manufactured into electroluminescent devices, electroluminescence properties better than the electroluminescence properties of the quantum dot of Example 4 are obtained. Accordingly, the quantum dots according to an embodiment exhibit high quantum efficiency and also have very desirable effects for manufacturing an electronic device such as an electroluminescent device and the like.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A quantum dot, comprising
a semiconductor nanocrystal core comprising indium and phosphorus, and
a semiconductor nanocrystal shell disposed on the semiconductor nanocrystal core, the semiconductor nanocrystal shell comprising zinc and selenium,
wherein the semiconductor nanocrystal shell is doped with a dopant metal having a larger ion radius than a radius of a $Zn^{2+}$ ion,
the quantum dot does not comprise cadmium, and
the quantum dot has a quantum efficiency of greater than or equal to 90% and a full width at half maximum of an emission peak of less than or equal to about 40 nanometers, and
wherein the semiconductor nanocrystal shell has a thickness of greater than or equal to about 3.5 nanometers,
the semiconductor nanocrystal shell does not comprise an outermost layer comprising zinc and sulfur, and
the semiconductor nanocrystal shell does not comprise sulfur.

2. The quantum dot of claim 1, wherein the dopant metal is present in an amount of about 0.01 moles to about 10 moles, based on 100 moles of a semiconductor nanocrystal forming the semiconductor nanocrystal shell.

3. An electronic device comprising
a first electrode and a second electrode facing each other; and
a quantum dot light emitting layer disposed between the first electrode and the second electrode, the quantum dot light emitting layer comprising the quantum dot of claim 1.

4. A quantum dot, comprising
a semiconductor nanocrystal core comprising indium and phosphorus, and
a semiconductor nanocrystal shell disposed on the semiconductor nanocrystal core, the semiconductor nanocrystal shell comprising zinc and selenium,
wherein the semiconductor nanocrystal shell is doped with a dopant metal having a larger ion radius than a radius of a $Zn^{2+}$ ion, wherein the dopant metal comprises sodium, calcium, potassium, yttrium, strontium, samarium, or a combination thereof,
the quantum dot does not comprise cadmium,
the quantum dot has a quantum efficiency of greater than or equal to 90% and a full width at half maximum of an emission peak of less than or equal to about 40 nanometers,
the semiconductor nanocrystal shell has a thickness of greater than or equal to about 3.5 nanometers,
the semiconductor nanocrystal shell does not comprise an outermost layer comprising zinc and sulfur, and
the semiconductor nanocrystal shell does not comprise sulfur.

5. The quantum dot of claim 4, wherein the dopant metal comprises sodium.

6. The quantum dot of claim 4, wherein the dopant metal is present in an amount of about 0.01 moles to about 10 moles, based on 100 moles of a semiconductor nanocrystal forming the semiconductor nanocrystal shell.

7. The quantum dot of claim 4, wherein the dopant metal is present in an amount of about 0.05 moles to about 5 moles, based on 100 moles of a semiconductor nanocrystal forming the semiconductor nanocrystal shell.

8. The quantum dot of claim 4, wherein a mole ratio of phosphorus relative to indium in the quantum dot is less than or equal to about 1:1.

9. The quantum dot of claim 4, wherein a mole ratio of zinc relative to indium in the quantum dot is greater than or equal to about 10:1.

10. The quantum dot of claim 4, wherein a mole ratio of selenium relative to indium in the quantum dot is greater than or equal to about 10:1.

11. The quantum dot of claim 4, wherein a semiconductor nanocrystal forming the semiconductor nanocrystal core further comprises zinc.

12. The quantum dot of claim 4, wherein a particle size of the quantum dot is greater than or equal to about 8 nanometers.

13. The quantum dot of claim 4, wherein the quantum dot has a peak emission wavelength between about 600 nanometers and about 650 nanometers.

14. An electronic device comprising
a first electrode and a second electrode facing each other; and
a quantum dot light emitting layer disposed between the first electrode and the second electrode, the quantum dot light emitting layer comprising the quantum dot of claim 4.

15. The electronic device of claim 14, wherein the quantum dot light emitting layer comprises a plurality of quantum dots and a particle size distribution of the quantum dots is less than or equal to about 20% of an average value.

16. The electronic device of claim 14, wherein the electronic device has external quantum efficiency of greater than or equal to about 10% and a life span T95 at 1,000 nits of greater than or equal to about 10 hours.

17. The electronic device of claim 14, further comprising a charge auxiliary layer between the first electrode and the quantum dot light emitting layer, between the second electrode and the quantum dot light emitting layer, or a combination thereof.

18. The electronic device of claim 14, wherein
the first electrode comprises an anode, and
the second electrode comprises a cathode, and
the electronic device further comprises
a hole injection layer, a hole transport layer, an electron blocking layer, or a combination thereof between the first electrode and the quantum dot light emitting layer, and an electron injection layer, an electron transport layer, a hole blocking layer, or a combination thereof between the second electrode and the quantum dot light emitting layer.

19. The electronic device of claim 18, comprising the electron transport layer between the second electrode and the quantum dot light emitting layer, wherein the electron transport layer comprises a zinc metal oxide.

* * * * *